(12) United States Patent
Pfahnl

(10) Patent No.: US 7,484,552 B2
(45) Date of Patent: Feb. 3, 2009

(54) MODULAR RACKMOUNT CHILLER

(75) Inventor: Andreas C. Pfahnl, Goffstown, NH (US)

(73) Assignee: Amphenol Corporation, Wallingford, CT (US)

( * ) Notice: Subject to any disclaimer, the term of this patent is extended or adjusted under 35 U.S.C. 154(b) by 165 days.

(21) Appl. No.: 10/741,542

(22) Filed: Dec. 19, 2003

(65) Prior Publication Data
US 2005/0133214 A1    Jun. 23, 2005

(51) Int. Cl.
*F28F 7/00* (2006.01)
*F28D 15/00* (2006.01)
*H05K 7/20* (2006.01)

(52) U.S. Cl. .................. 165/80.4; 165/104.33
(58) Field of Classification Search ............... 165/80.4, 165/104.33, 104.21, 185; 361/687, 699, 361/695, 697, 702, 724, 725, 727; 174/15.1; 257/714–716; 62/259.1, 259.2
See application file for complete search history.

(56) References Cited

U.S. PATENT DOCUMENTS

| | | | | |
|---|---|---|---|---|
| 2,880,397 | A * | 3/1959 | Howery | 333/13 |
| 3,512,582 | A * | 5/1970 | Chu et al. | 165/104.27 |
| 5,121,788 | A * | 6/1992 | Carollo | 165/47 |
| 5,144,531 | A * | 9/1992 | Go et al. | 361/702 |
| 5,316,077 | A * | 5/1994 | Reichard | 165/104.28 |
| 5,323,847 | A | 6/1994 | Koizumi et al. | |
| 5,680,294 | A * | 10/1997 | Stora et al. | 361/695 |
| 5,731,954 | A * | 3/1998 | Cheon | 361/699 |
| 5,941,300 | A * | 8/1999 | Colling et al. | 165/47 |
| 5,999,403 | A * | 12/1999 | Neustadt | 361/695 |
| 6,166,907 | A * | 12/2000 | Chien | 361/699 |
| 6,191,945 | B1 * | 2/2001 | Belady et al. | 361/704 |
| 6,234,240 | B1 | 5/2001 | Cheon | |
| 6,263,957 | B1 * | 7/2001 | Chen et al. | 165/80.4 |
| 6,313,990 | B1 * | 11/2001 | Cheon | 361/699 |
| 6,317,320 | B1 | 11/2001 | Cosley et al. | |
| 6,342,168 | B1 * | 1/2002 | Isherwood | 252/73 |
| 6,351,381 | B1 * | 2/2002 | Bilski et al. | 361/695 |
| 6,504,719 | B2 * | 1/2003 | Konstad et al. | 361/698 |
| 6,587,343 | B2 * | 7/2003 | Novotny et al. | 361/698 |
| 2004/0008483 | A1 * | 1/2004 | Cheon | 361/687 |
| 2004/0250992 | A1 * | 12/2004 | Aoki et al. | 165/80.3 |

FOREIGN PATENT DOCUMENTS

EP   1 372 367 A1   12/2003

OTHER PUBLICATIONS http://www.lytron.com/standard/cs_mod_pics.htm; Mar. 3, 2004; pp. 1-2; Lytron Cooling System.

(Continued)

*Primary Examiner*—Tho v Duong
(74) *Attorney, Agent, or Firm*—Blank Rome, LLP

(57) ABSTRACT

A chiller assembly shaped for use in a standard electronics rack. The chiller has a low profile, and is capable of being made to occupy less than 5 rack units. The chiller is modular, with subassemblies positioned to allow easy removal for maintenance. The fan and power supply are made as replaceable subassemblies that can be inserted or removed from the front of the unit without any special tools. The pump is made with a magnetically coupled motor, allowing the motor to be easily removed for service or replacement. The motor is also accessible from the front panel of the assembly.

19 Claims, 4 Drawing Sheets

OTHER PUBLICATIONS http://www.lytron.com/standard/cs_mod_pics.htm; Mar. 3, 2004; pp. 1-2; Lytron specialized cooling systems, liquid cooling and modular cooling systems.

http://www.koolance.com/products/product.html?code=RM1-2U &category_id=2; Mar. 3, 2004; pp. 1-2; Koolance-Superior Liquid Cooling Solutions.

http://www.koolance.com/products/product.html?code=EXT-A04 &category_id=2; Mar. 3, 2004; pp. 1-2; Koolance-Superior Liquid Cooling Solutions.

International Search Report, Mailing Date Jun. 13, 2005.

* cited by examiner

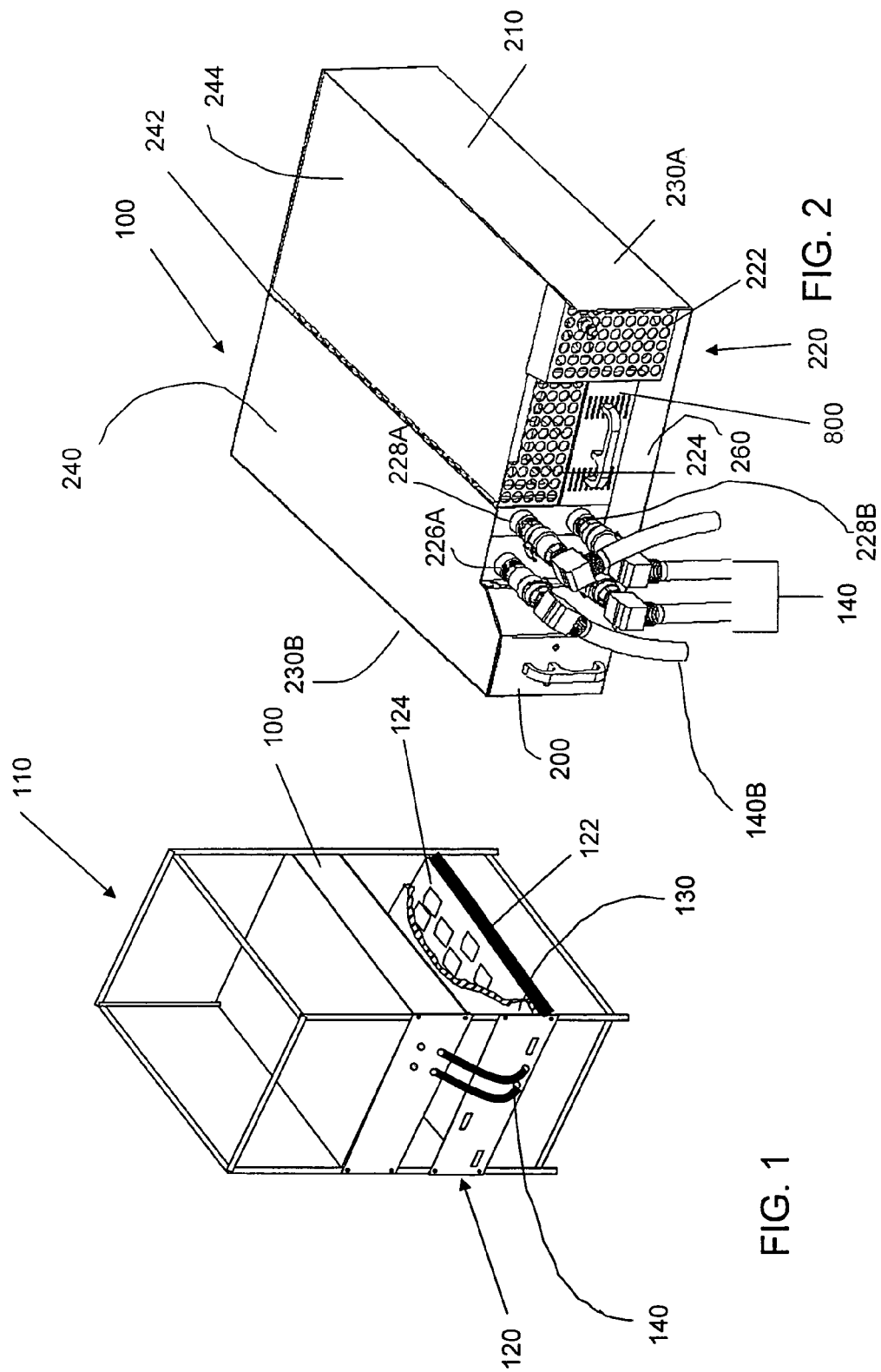

MODULAR RACKMOUNT CHILLER

BACKGROUND OF INVENTION

1. Field of Invention

This invention relates generally to electronic assemblies and more specifically to thermal management in an electronic assembly.

2. Discussion of Related Art

Many modern electronic systems are constructed by attaching electronic components to printed circuit boards. The printed circuit boards are then installed into a mechanical chassis (i.e. subassembly), which allows them to be installed into a larger frame. In some cases, multiple boards are installed and electrically interconnected within a chassis. The frame, also called the "rack", provides the mechanical support for each chassis.

The frame also allows each chassis to be electrically interconnected. The boards in one chassis can be electrically interconnected to the boards within other chassis through the same frame. In the most common frame configurations, the printed circuit boards are installed parallel to the ground. The common alternative is to have them installed vertically.

Many electronic manufacturers have agreed on standards for the dimensions of the frames, and also the chassis. In this way, the printed circuit boards installed in the frame can be made by many different companies, but can all easily be included in an assembly. Standardization allows an original equipment manufacturer making an electronic system to buy printed circuit boards from multiple sources to either provide special functionality or to take advantage of economies of scale that result when a supplier sells standard sized components to many manufacturers.

As an example, a rack might be 19 inches (46.55 cm) or 23 inches (56.4 cm) wide. Also, the rack might be defined with units of height, such as 1.75 inches (4.3 cm). Preferably, the opening in the rack is between 18 and 24 inches wide and less than 9 inches in height. These units are sometimes called "rack units." As used herein, a "rack unit" defines the smallest distance in a particular dimension that can be allotted to any subassembly or chassis. Subassemblies may be taller than one rack unit, but when installed in a frame, space for the subassembly is allocated in integer multiples of rack units. The Enterprise Applications Integration (EAI) organization sets many of these definitions and further examples can be found on their web page at www.eaiindustry.org.

Cooling challenges can arise with rack-mount multi-board chassis or sub-assemblies, because of their limited cooling capacity. For example, electronic systems generally become more powerful (e.g. faster) as each new product is created. More powerful electronics generally require more electrical power and consequently generate more heat. This trend of increasing power is most commonly observed with computer central processors.

However, end users or customers expect that old electronics can be swapped for new ones without requiring any impact on the electrical, mechanical or thermal subsystems. For example, in the case of multi-board chassis or subassemblies, customers expect that new boards fit into the same slot as the predecessor board. In single board electrical systems, customers expect that new computer processors, which are typically the highest power and power density electronic component, will be a direct replacement for an existing processor. As a result, in both cases, the new electronics must be packaged in the same volume as the ones they replace. Miniaturization of electronic circuitry often makes it possible to build new and more powerful electronics in the same volume as was occupied by an earlier less powerful system or component.

However, the amount of power generated by powerful electronic circuits in constrained volumes can be a problem. As more heat is generated in the same volume, the heat density increases. As the heat density increases, the temperature of the circuitry is likely to rise. As the temperature rises, the electronic components might malfunction with greater frequency, prematurely fail, or fail to operate with their intended performance.

It is likely that over the next few years, the amount of power generated by a state of the art computer board will more than double. We have recognized that for sophisticated electronic circuitry that already generates large amounts of power, it is likely that traditional direct air-cooling techniques, using for instance cooling fans, will not adequately cool the subassemblies mounted in racks. We have recognized the benefits of providing a means to transport a portion or all of the heat to another physical location where it is easier to dissipate the heat to air, because of the greater amount of available space.

Methods for transporting liquid significant distances and then dissipating the heat are known. For example, a common one being exploited in electronics cooling is single-phase liquid cooling where a device called a "chiller" is mounted in the rack. The chiller circulates fluid through hoses to a "cold plate" that rests over the electronic circuitry in a subassembly with a high power density. As the electronic circuitry generates heat, the cold plate absorbs the heat. The heat is then absorbed by the fluid circulating inside the cold plate.

The circulating fluid is returned to the chiller where it is pumped through a radiator. Fans induce airflow through the radiator, which dissipates the heat. In this way, the heat is dissipated without an undesirable increase in the temperature of the high power circuit.

It would be desirable if an improved chiller were available that is suitable for use in electronic assemblies.

SUMMARY OF INVENTION

With the foregoing background in mind, it is an object to provide an improved chiller for use in an electronic assembly.

An improved chiller is provided with a desirable arrangement of components. In one embodiment, the chiller fits within standard dimensions. In the most preferred embodiment, the chiller is 3 rack units or less.

In another embodiment, the chiller has components that can be easily accessed or removed when the chiller is mounted in a rack. The preferred embodiment has blind-mate electrical connections to a fan assembly and a power supply so that these components can be inserted into the assembly without removing the entire chiller from the rack. In a most preferred embodiment, a pump on the chiller includes a magnetically coupled motor, allowing the motor to be removed without removal of the chiller unit from the frame.

In the preferred embodiment, the motor has an orientation and position in the chiller that allows it to be removed without removing the entire chiller from the rack. In other aspects, other access to the chiller and chiller controls is readily obtained through the front face of the chiller while it is still in a rack.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1 is a simplified sketch of an electronic assembly employing the invention;

FIG. 2 is a sketch of a front view of a chiller assembly;

DETAILED DESCRIPTION

Figure 4:
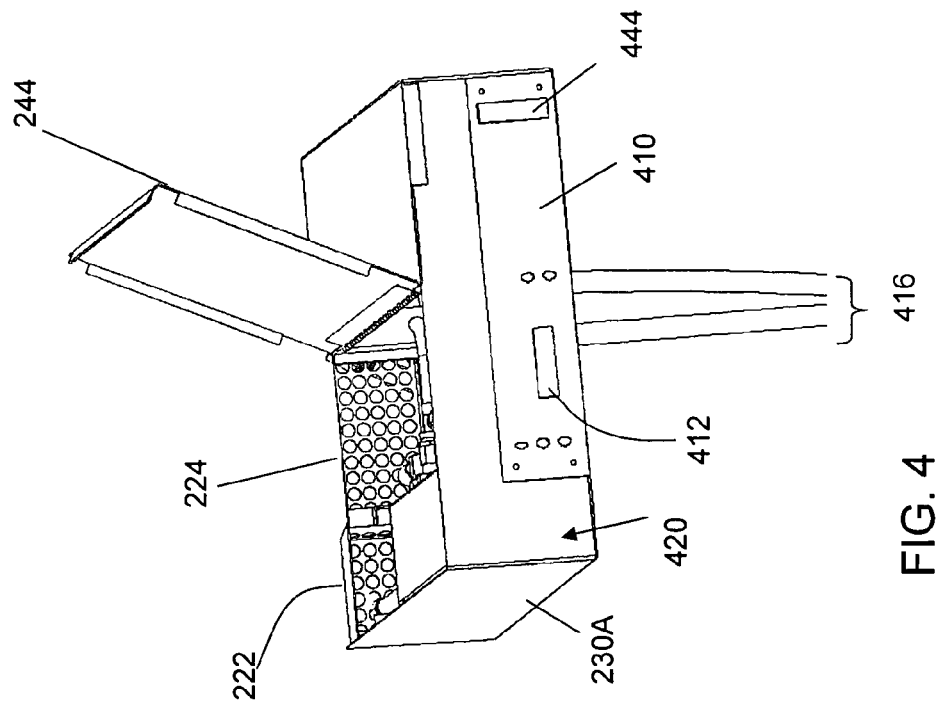
FIG. 4 is a sketch of a rear view of the chiller assembly of FIG. 2 partially disassembled.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

FIG. 1 shows a chiller assembly 100 mounted in a frame. Here, the frame is in the form of rack 110. Rack 110 is designed to accept many subassemblies. For clarity, only a single subassembly 120 is shown. However, the number of subassemblies mounted in the rack is not important for the invention.

Subassembly 120 includes a printed circuit board 122 on which many electronic components 124 are mounted. In use, electronic components will generate heat.

To allow powerful components to be used that generate a relatively large amount of heat, subassembly 120 is equipped with a fluid circulating member. In the preferred embodiment, the fluid circulating member is cold plate 130. The precise shape of cold plate 130 is not important to the invention. However, cold plate 130 is positioned near the electronic components that generate large amounts of heat. Preferably, cold plate 130 is in thermal contact with those components to increase the heat transfer from the electronic components 124 to cold plate 130.

Cold plate 130 contains passages through which fluid from chiller 100 circulates. Chiller 100 pumps fluid through fluid carrying members. In the preferred embodiment, hoses 140 are used to carry fluid. One hose carries fluid to the cold plate and the other hose carries fluid back to chiller 100.

FIG. 2 shows chiller assembly 100 in greater detail. Chiller assembly is contained within case 210. Case 210 may be made from any convenient material. Preferably sheet metal is used to form case 210. Because case 210 serves as a support for the components within chiller assembly 100, braces or other reinforcing members may be used in addition to sheet metal. Techniques for forming a case are well known in the art. The specific construction of case 210 is not critical to the invention.

Case 210 has a face 220. In a preferred embodiment, all access to chiller assembly 100 will be made through face 220 during normal operation of chiller assembly 100.

Pump cover 222 may be removed to provide access to pump and motor assembly 600, which is described in greater detail below in connection with FIG. 6. Power supply tray assembly 800 may be removed through face 220. Power supply tray 800 is described in greater detail below in connection with FIG. 8.

Fluid outlets 228A and 228B provide a connection to two cold plates. Here fluid outlet 228B is shown connected to one of the hoses 140. Fluid inlets 226A and 226B provide a return path for the connections to cold plates.

Fan assembly 700 may also be removed from chiller assembly 100 through face 220. Fan assembly 700 is described below in greater detail in connection with FIG. 7.

Cover 224 covers remaining space in face 220. In the preferred embodiment cover 224 is made of a perforated metal. Perforations are intended to allow airflow through chiller assembly 100. Case 210 has sidewalls 230A and 230B. Preferably sidewalls 230A and 230B are also made up of perforated metal to allow airflow through chiller assembly 100. Here cover 224 is shown with circular perforations. The shape of the openings in covers such as 222 and 224 and sidewalls 230A and 230B is not critical. Perforations will be formed by any convenient means. However, in a preferred embodiment the openings within the perforated surfaces will be shaped using known design techniques to optimize airflow through chiller assembly 100.

Case 210 has a top surface 240. Here, top surface 240 is shown to contain a hinge 242 that allows door 244 to open. In normal use chiller assembly 100 will be mounted in a rack such as rack 110. Other sub assemblies can be placed in the rack above chiller assembly 100. Thus, when chiller assembly 100 is installed in a rack, door 244 may be blocked from opening. Door 244 is provided for servicing the internal components of chiller assembly 100 when it is removed from rack 110. FIG. 1 shows that chiller assembly 100 is mounted to rack 110 with a flange on face 220. The flange is not shown in FIG. 2. However, mounting flanges can be formed in any convenient way. For example, flanges can be bolted onto the sidewalls 230A and 230B. Also, it might be desirable to provide mounting flanges at all four corners of case 210 to support the weight of chiller assembly 100.

Figure 3:
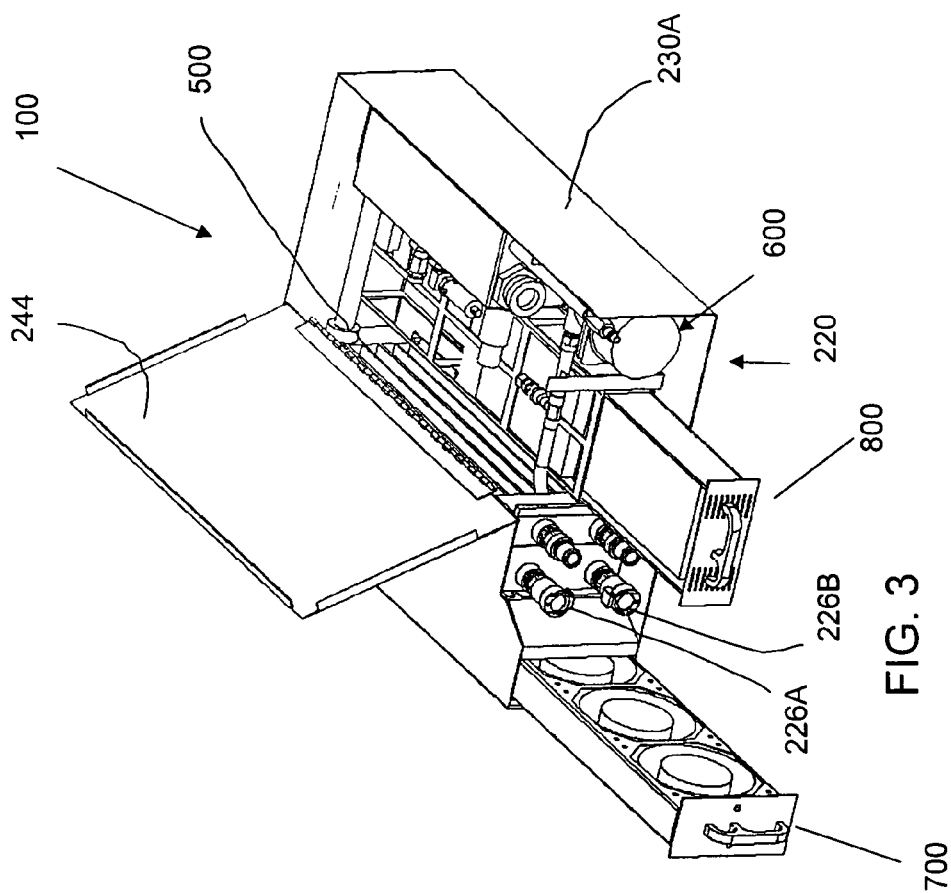
FIG. 3 is a sketch of a front view of the chiller assembly of FIG. 2 partially disassembled.

Turning to FIG. 3, addition of details of the construction of chiller assembly 100 can be seen. FIG. 3 shows chiller assembly 100 partially assembled. Pump cover 222 and cover 224 have been removed. Also service access door 244 is shown in the open condition. Fan assembly 700 is partially removed from case 210. Likewise, power supply tray 800 is also shown partially removed. Both fan assembly 700 and power supply tray 800 can be installed and removed by sliding them through face 220.

In FIG. 3, pump and motor assembly 600 can be seen. Likewise, radiator assembly 500 is visible.

In operation, pump tank module 600 pumps fluid through fluid outlets 228A and 228B. The fluid flows through hoses such as 140 and 140B to a cold plate such as cold plate 130. In the cold plate, the fluid absorbs heat from an electronic assembly such as electronic assembly 120. The warmed fluid then returns to chiller assembly 100 through fluid inlets 226A and 226B. In the preferred embodiment, fluid inlets 226A and 226B are coupled directly to radiator module 500. As the fluid flows through radiator module 500, fan module 700 draws air through chiller unit 100. The air flowing through chiller unit 100 flows through radiator module 500, carrying away the heat from fluid passing through radiator module 500 and dispersing it to the outside air. After flowing through radiator module 500, fluid returns to pump-tank module 600 where it can again be pumped to a cold plate 130.

Power to operate fan module 700 and pump tank module 600 is supplied by power supply module 800. As will be described in greater detail in connection with FIG. 4, power supply module 800 connects to a power feed within rack 110 and generates voltages of the appropriate level to control fan assembly 600 and pump-tank module 600.

In the preferred embodiment fan module 700 will cause an air flow from right to left as shown in FIG. 3. As can be seen, power supply module 800 is shorter than then radiator module 500. This difference in height leaves an air flow passage next to radiator module 500. Also pump-tank module 600 does not fully block side wall 230A. Because of these relative sizes of components, air flow passages are provided to allow air to flow through case 210.

Turning to FIG. 4, a rear view of chiller assembly 100 is shown. Rear face 420 includes a backplane 410. Backplane 410 can be a printed circuit board that incorporates conductive traces to route electrical signals. Alternatively, backplane 410 might be a substrate, such as a piece of metal, to which connectors are attached. If backplane 410 does not include conductive traces, then discrete wiring or other type of electrical connections can be used. Backplane 410 need not be included in chiller assembly 100. It facilitates manufacture of chiller assembly 100 and provides additional support to case 210. But, the same results can be achieved by attaching connectors directly to case 210 or using discrete wiring.

Backplane 410 includes connectors 412 and 414. Connectors 412 and 414 are included to allow blind mating of electrical components in chiller assembly. Connector 412 mates with power supply module 800 and connector 414 mates with fan module 700. Connectors 412 and 414 can be electrical connectors as known in the art. Such connectors have a mating face and at least one other face to which electrical conductors are attached.

The mating faces of connectors 412 and 414 face into case 210. FIG. 4 shows the area in which electrical conductors are attached to connectors 412 and 414. The specific form of the attachment will depend on the specific construction of backplane 410. For some forms of attachment, connectors 412 and 414 might not be visible from rear face 420. For example, if backplane 410 is constructed with a printed circuit board, connectors 412 and 414 might be mounted to the surface of the board facing into case 210.

Wires 416 extend from backplane 410. Wires 416 connect to other parts of the electronic system in rack 100. Wires carry signals as are known in the art. The number and types of signals will depend on the desired functionality of the electronic system contained in rack 110. Wires 416 carry signals such as a power input to chiller assembly 100. Additionally, wires 416 can carry control signals to chiller assembly 100 or status signals from chiller assembly 100. For example, chiller assembly might contain a temperature sensor to monitor the temperature of fluid coming from or going to cold plate 130.

FIG. 4 also shows portions of covers 222 and 224. From this view, it can be seen that there are passages within case 210 that allow air to flow through covers 222 and 224 to radiator module 500. The view of FIG. 4 also reveals that pump-tank module 600 does not block all of side wall 230A, providing another passage for air to flow to radiator module 500.

Figure 5:
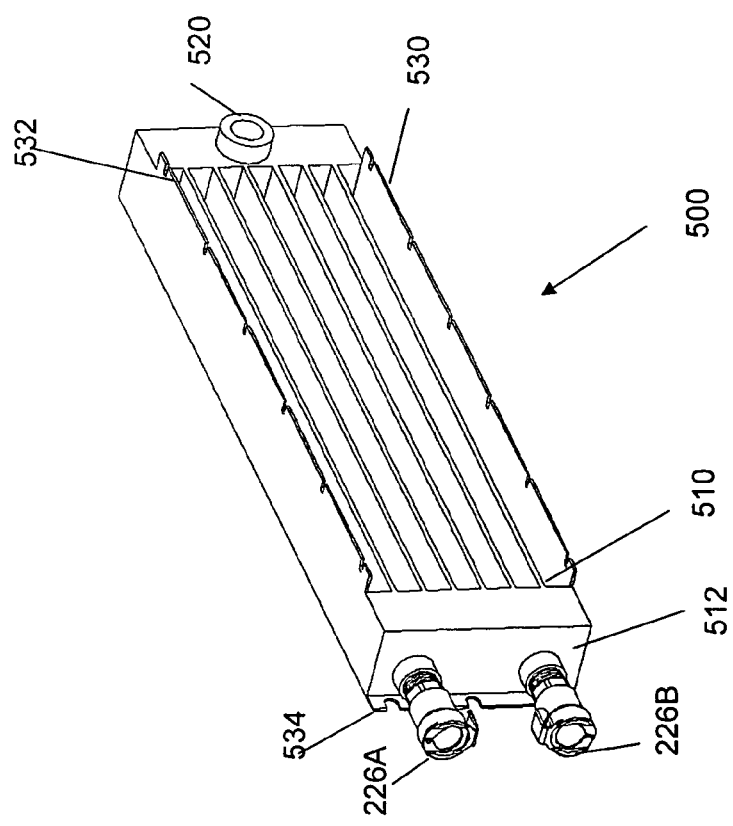
FIG. 5 is a sketch of a radiator assembly suitable for use in the chiller of FIG. 2.

FIG. 5 shows radiator module 500 in greater detail. Fluid inlets 226A and 226B are part of radiator module 500. As can be seen in FIG. 2, fluid inlets 226A and 226B are exposed through face 220, allowing connections to radiator module 500 to be made or removed while chiller assembly 100 is installed in a rack. In the preferred embodiment, surface 512 of radiator module 500 forms part of face 220.

Radiator module 500 is preferably made from a non-corrosive material with a high thermal conductivity. In the preferred embodiment, radiator module 500 is made of aluminum. Radiator module 500 may be formed using any known construction technique.

Within radiator module 500, passages connect fluid inlets 226A and 226B to fluid outlet 520. The passages flow through areas of radiator module 500 with a high surface area. These areas facilitate transfer of heat from fluid within radiator module 500 to air flowing through chiller assembly 100. In the preferred embodiment, the high surface areas are vertical fins attached to liquid passages 510. The vertical fins fill the area between the liquid passages 510.

Radiator module 500 includes mounting flanges, such as flanges 530, 532 and 534. In the preferred embodiment, radiator module 500 is secured to case 210, such as with screws passing through mounting flanges 530, 532 and 534. In the presently preferred embodiment, radiator module 500 is not intended to be a field replaceable unit. Accordingly, many other forms of attachment could be used. Fixed attachments, such as welding, brazing or riveting, might be used.

Radiator module also includes outlet 520. Outlet 520 is connected to the liquid passages inside radiator module 500. When radiator module 500 is installed in chiller assembly 100, radiator module 500 is connected to pump-tank module 600 through outlet 520. In the preferred embodiment, pipe 620 (FIG. 6) is connected to fluid outlet 520. Where radiator module 500 is not intended to be field removable, a fixed connection can be made between outlet 520 and pipe 620. In a presently preferred embodiment, pipe 620 is also made of aluminum and is welded to radiator module 500.

Figure 6:
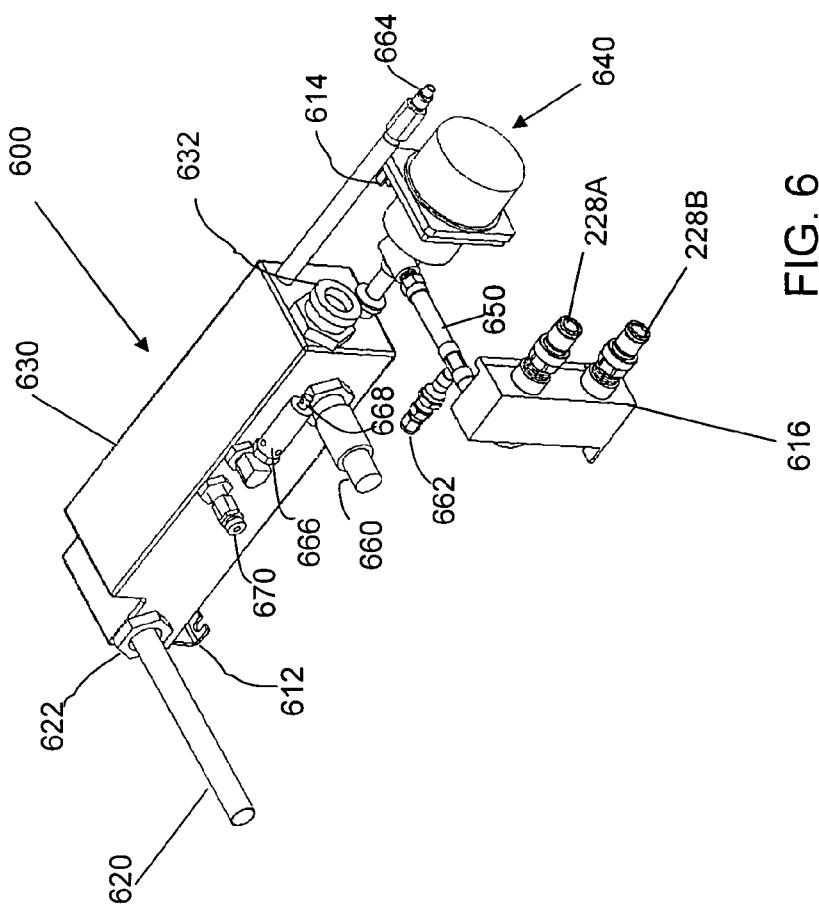
FIG. 6 is a sketch of the pump assembly of the chiller of FIG. 2.

Referring now to FIG. 6, pump tank module 600 includes a tank 630, and a pump 640. Tank 630 acts as a reservoir for cooling fluid. Preferably tank 630 holds between one half U.S. gallon and three U.S. gallons of cooling fluid. In the preferred embodiment the cooling fluid is hydrofluroether (HFE). HFE is a preferred material because, even if it leaks from chiller assembly 100 or hoses 140, it will not interfere with the operation of the electronics within the electronic assembly. HFE has a high dielectric constant and a relatively high vapor pressure. The high vapor pressure means that the material readily evaporates if it leaks. The high dielectric constant means that it will not short-circuit the electronic components. However, other cooling fluids could be used.

HFE is a single-phase coolant, meaning that it stays in its liquid state over the range of temperatures it might be exposed to while the electronics assembly is operating. However, two-phase coolants could also be used. A two-phase coolant would evaporate or boil inside cold plate 130. If a two-phase coolant were used, radiator module 500 would act as a condenser, cooling the fluid back to a liquid state. However, the specific form of fluid used is not critical to the invention. Pump-tank module 600 is preferably mounted to case 210. Mounting flanges such as 612 and flange 614 are used for securing pump tank module 600 to the case. Mounting flanges can be provided in any convenient location.

As described above, pipe 620 connects to radiator module 500. Pipe 620 is attached to tank 630 via coupling 622. In the preferred embodiment, coupling 622 is a compression fitting, allowing for easy assembly or disassembly of the unit. However, any convenient method of joining pipes can be used.

Tank 630 includes a sight glass 632. Sight glass 632 allows observations of the fluid within tank 630. When pump tank module 600 is mounted within case 210, sight glass 632 will be visible when pump cover 222 is removed.

Pipe 638 joins tank 630 to pump assembly 640. Pump assembly 640 includes a pump that forces fluid to flow from chiller assembly 100 to cold plate 130. Such pumps are know in the art. Such a pump would generally include an impeller to cause movement of the fluid and a motor to cause movement of the impeller. In the preferred embodiment, the motor is magnetically coupled to the impeller. In this way, the motor can be removed for servicing without disconnecting the impeller from tank 630. Because the motor contains moving parts and is one of the most likely components to fail within chiller assembly 100, it is desirable to allow for easy replacement of the motor. The motor can be held in place by any convenient means, such as screws or bolts. When chiller assembly 100 is assembled, the motor will be positioned behind pump cover 222 (see FIG. 2). This positioning allows for easy replacement of the motor. The motor may be replaced by removing pump cover 222 and removing the screws holding motor in place. A new motor may then be installed. In this way, the entire repair can be made from face 220, which is generally accessible while chiller assembly 100 is installed in rack 110. Also, the entire repair can be made without breaking any of the seals within chiller assembly 100.

Pump 640 is connected to pipe 650. Pipe 650 carries fluid to the fluid outlets 228A and 228B. Fluid outlets 228A and 228B extend through surface 616. As seen in FIG. 2, surface 616 forms a portion of face 220. Here, pump 640 is shown connected to two fluid outlets 228A and 228B. However, the number of fluid outlets is not critical to the invention.

Pump-tank assembly 600 includes sensors that allow monitoring of the operation of the chiller assembly. Sensors might indicate a potential problem with the operation of the chiller assembly itself. Or, sensors might indicate a problem with a printed circuit board 122. For example, excessive power consumption in board 122 might signal a problem with that board. Excessive power dissipation might appear as a rise in the temperature of the chiller assembly 100. Information from status sensors can be utilized in many different ways. An electronic controller within chiller assembly 100 might illuminate status lights on front face 220 based on sensor outputs. Or, the information might be transmitted as electronic signals through connectors in backplane 410 to a system controller within rack 110.

Level sensor 660 is an electronic device that outputs an electronic signal indicating the level of cooling fluid within tank 630. Fitting 662 is included in the illustrated embodiments to allow a temperature sensor (not shown) to be attached. A temperature sensor could measure the temperature of the fluid.

Pump-tank module 600 also includes features that allow the fluid within pump-tank assembly 600 to be refilled. In the preferred embodiment, these features are accessible through front face 220 (FIG. 2).

Fill port 664 is connected to tank 630. As shown in FIG. 2, fill port 664 is accessible through face 220.

To add fluid, it might be necessary to release pressure within tank 630. Releasing pressure is achieved by allowing air to escape. Fluid added through fill port 664 replaces the air. Pressure relief valve 666 is connected to tank 630. Pressure relief valve 666 includes actuator 668. Preferably, actuator is spring loaded so that it is normally closed. To fill tank 630, actuator 668 is pulled. In a preferred embodiment, actuator 668 is positioned so that a chain (not shown) may be attached to actuator 668. The chain could be pulled through face 220, thereby allowing the fluid to be replenished inside tank 630 entirely from the front face 220.

Because pressure relief valve is spring loaded, it can open if there is excessive pressure inside tank 630. The pump-tank assembly also includes a vacuum relief valve 670. If the pressure inside tank 630 is much lower than the ambient pressure, the vacuum relief valve can open to equalize the pressure. Pressure relief and vacuum relief valves are known in the art. They are useful in a system, such as chiller assembly 100, in which the temperature could change significantly in use.

Figure 7:
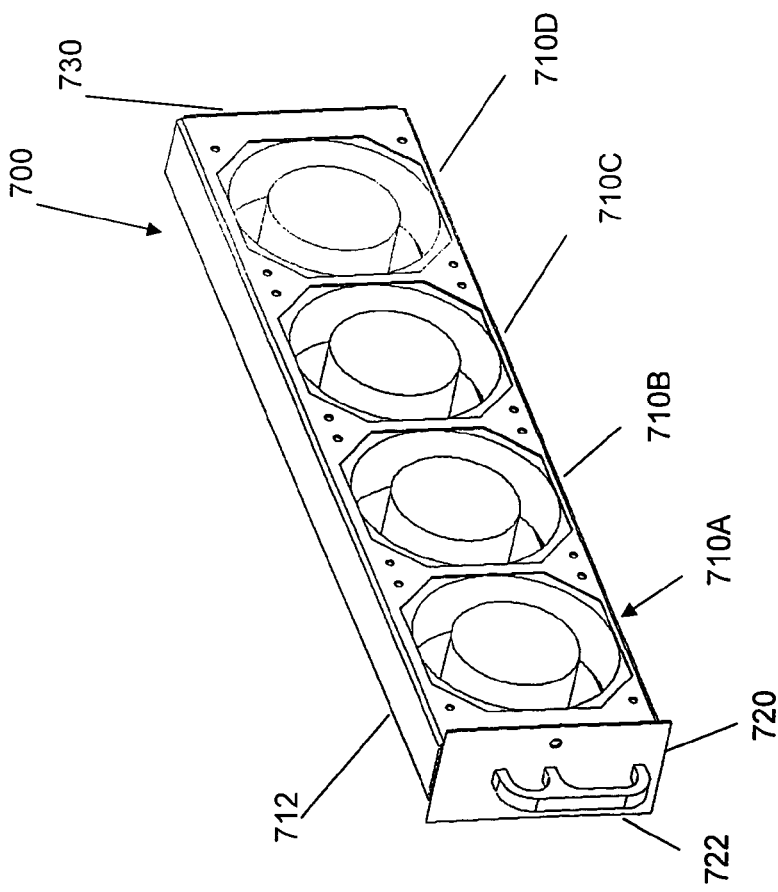
FIG. 7 is a sketch of the fan assembly of the chiller of FIG. 2.

FIG. 7 shows fan module 700. Here, fan module 700 is shown to contain four fans 710A, 710B, 710C and 710D. These fans can be of the type conventionally used in electronic systems. The fans are sized so that when fan module is inserted into chiller assembly 100 next to radiator modular 500, the fans draw air through radiator module 500. The fans are mounted in the frame 712. Frame 712 allows the fans to be handled as an integrated module. Wires carrying electricity to fans 710A, 710B, 710C and 710D can also be routed within frame 712. Frame 712 includes a surface 720 with a handle 722. As seen in FIG. 2, surface 720 forms a portion of face 220. Handle 722 is exposed on face 220. Handle 722 provides a convenient mechanism to remove fan module 700 from chiller 100.

Frame 712 also includes a rear surface 730. When fan module 700 is inserted into chiller assembly 100, rear surface 730 is positioned next to back plane 410. A connector adapted to mate with connector 414 is mounted to rear surface 730. Frame 712 is preferably sized to slide within a track inside case 210. In this way, fan module 700 slides easily into chiller assembly 100. Connectors on the rear surface 730 of fan module 700 will align with connectors on back plane 410. In this way, fan module 700 may be blind mated to the connectors. No special tools are required to connect electric power to the fans 710A, 710B, 710C and 710D. Also fan module 700 may be installed and removed through face 220.

Figure 8:
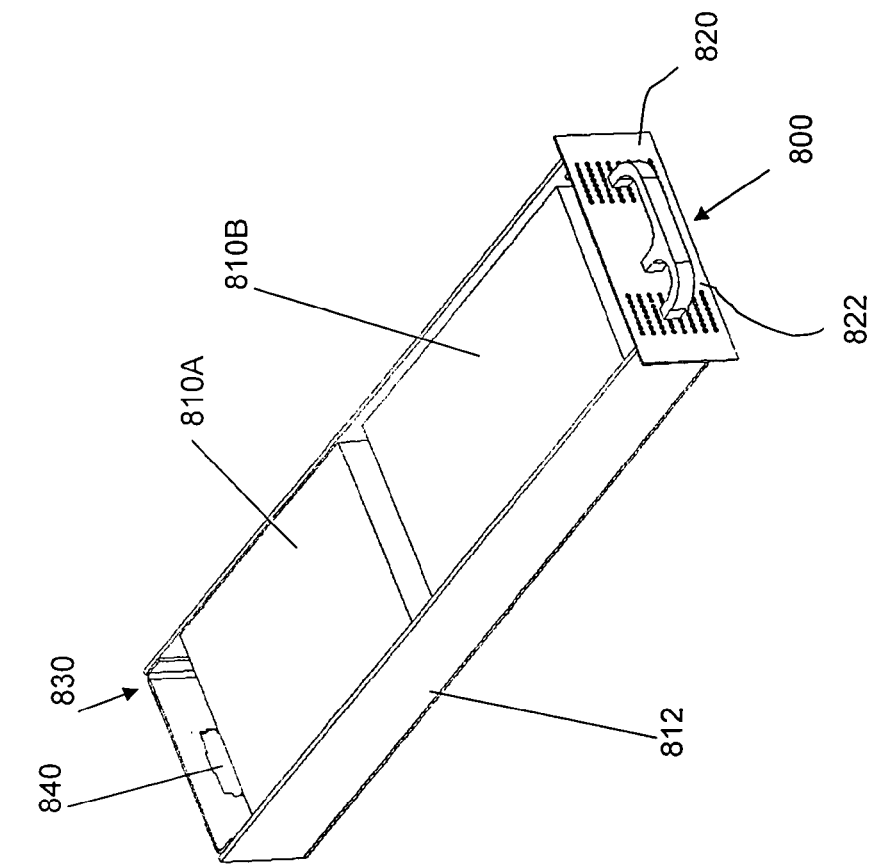
FIG. 8 is a sketch of the power supply assembly of the chiller of FIG. 2.

Turning to FIG. 8, power supply module 800 is shown to contain two power supplies 810A and 810B. Power supplies 810A and 810B are selected to provide power required to operate fan module 700 and pump 640. If other electronic circuitry, such as sensors, is included within chiller assembly 100, power supplies 810A and 810B should be sized to also provide power for this circuitry.

Power supplies are known in the art and any convenient power supply may be used. In the preferred embodiment two separate power supplies 810A and 810B are used because they are commercially available and fit within tray 812. A single power supply fitting within tray 810 might also be used.

Tray 812 holds power supplies 810A and 810B and allows them to be removed as a single module. Tray 812 has a surface 820. As seen in FIG. 2, surface 820 forms a portion of face 220. Handle 822 is mounted to surface 820. As can be seen in FIG. 2, handle 822 is accessible through face 220. In this way power supply module 800 may be easily installed or removed in chiller assembly 100 through face 220.

As can also be seen, surface 820 includes perforations. These perforations allow for the flow of air through surface 820 to increase the rate at which heat is removed from radiator module 500.

Tray 812 includes a rear surface 830. When power supply module 800 is installed in chiller assembly 100, rear surface 830 will preferably be positioned next to back plane 410 a connector mounted on rear surface 830 can engage connector 412 on back plane 410. Tray 812 also contains the wiring between connector 840 and power supplies 810A and 810B. Preferably, the electrical connections between power supplies 810A and 810B and fan module 700 and pump 640 will be made through connector 840. In this way, power supplies 810A and 810B can be installed or removed easily.

Power supply module 800 has a height that is preferably less than the height of case 210. In this way, when power supply module 800 is installed in chiller assembly 100, a space for airflow above power supply module 800 will be provided.

The type of fluid used within chiller assembly 100 is not critical to the invention. Water, oil or similar fluids might be used. However, these materials are not preferred. If these material leak, they can interfere with the operation of the electronic assembly. Oil, even if not conductive, is messy. Water can short out electronic components and can promote corrosion.

In the preferred embodiment, a fluid with a low dielectric constant and a high vapor pressure is used, specifically materials with a vapor pressure greater than 2,000 Pascals (measured at ambient temperature of approximately 25° C.). One such material is hydrofluoroether, sometimes referred to as HFE-7100 and HFE-7500.

A material with a dielectric constant lower than water is preferred. Preferably, a material with a dielectric constant (relative to a vacuum) below 25 will be used.

Most fluids but in particular ones with a relatively high vapor pressure might require the use of seals. The preferred embodiment shows quick disconnect couplings used to make separable connections. Preferably, these connections include O-rings or other seals to reduce the escape of the cooling fluid. Also, where assembly and disassembly is not required, hard connections are preferably used. For example, welding is described as connecting pipe 620 to radiator module 500.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention.

For example, components of the chiller assembly are described as being accessible through openings in the front of the chiller assembly. It should be appreciated that in this context an opening could be an area bounded by a rigid frame. But, where a rigid frame around individual components is not required, the openings referred to herein could be regions within a larger opening.

As another example, power supplies 810A and 810B are shown mounted in a tray. Any convenient structure can be used for mounting. Preferably, though, the structure allows the power supplies to easily slide in and out of the case. The structure may also have perforated sidewalls to improve airflow across the power supplies. The structure may also have a cover over the top of the power supplies, again with or without perforation.

In the preferred embodiment, fluid inlets and fluid outlets to connect the chiller assembly to two cold plates are shown. The number of connections is not critical to the invention. However, as more connections are added, the chiller assembly will likely have to be made taller. We have found that two connections will fit in a chiller assembly that is 3 rack units high.

Also, the chiller assembly described above removes heat from an electronic assembly to a remote location where the heat can be dissipated to the air surrounding the electronic assembly. This remote location is preferably located in the same rack, but can be in another rack, a different room, and even on the exterior of a building.

Further, the chiller assembly is pictured mounted in a rack with boards mounted horizontally. The chiller assembly could be used in a vertical arrangement. Therefore, mounting arrangement, dimensions and orientations of components described above should be interpreted as examples of a preferred embodiment and should not be interpreted to preclude a vertical version of a chiller assembly.

Accordingly, the foregoing description and drawings are by way of example only.

What is claimed is:

1. A cooling assembly comprising:
   a front face having an opening therein;
   a back having at least one electrical connector mounted thereon;
   a fan assembly inserted in the opening, the fan assembly having a second electrical connector thereon, the second electrical connector engaging the at least one electrical connector on the back, wherein said fan assembly forms an air flow;
   a heat exchanger for receiving heated fluid, wherein said heat exchanger is positioned to be in the air flow caused by the fan assembly, the air flow cooling the heated fluid to provide cooled fluid at an output;
   a fluid reservoir;
   at least one fluid inlet on the front face for receiving fluid from an exterior of the cooling assembly;
   at least one fluid outlet on the front face for dispensing fluid to the exterior of the cooling assembly; and
   a pump connected to the heat exchanger and the fluid reservoir to pump heated fluid from the at least one fluid inlet to the heat exchanger and to pump cooled fluid from the output of the heat exchanger through the fluid reservoir to the at least one fluid outlet.

2. The cooling assembly of claim 1 wherein the fan assembly comprises a surface parallel with the front face and a handle mounted on the surface.

3. The cooling assembly of claim 1 wherein the pump comprises a motor that can be removed from the pump without disconnecting the pump from the fluid reservoir.

4. The cooling assembly of claim 1 wherein the fluid reservoir has a fluid level indicator thereon, the fluid level indicator visible through an opening in the front face.

5. A cooling assembly comprising:
   a front face having an opening therein;
   a back having a first electrical connector and a second electrical connector mounted thereon;
   a fan assembly inserted in the opening, the fan assembly having a third electrical connector thereon, the third electrical connector engaging the first electrical connector on the back, wherein said fan assembly forms an air flow from an interior of the cooling assembly to an exterior of the cooling assembly;
   a power supply assembly inserted in the opening, coupled to the fan assembly, the power supply assembly having a fourth electrical connector thereon, the fourth electrical connector engaging the second electrical connected on the back;
   a heat exchanger for receiving heated fluid, wherein said heat exchanger is positioned to be in the air flow caused by the fan assembly, the air flow cooling the heated fluid to provide cooled fluid at an output;
   a fluid reservoir;
   at least one fluid inlet on the front face for receiving fluid from an exterior of the cooling assembly;
   at least one fluid outlet on the front face for dispensing fluid to the exterior of the cooling assembly; and
   a pump connected to the heat exchanger and the fluid reservoir, wherein the pump, the fluid reservoir, at least one fluid inlet and at least one fluid outlet are in fluid communication.

6. The cooling assembly of claim 5 wherein the power supply has a third electrical connector making electrical connection to the electrical connector mounted on the back.

7. The cooling assembly of claim 5, wherein the pump comprises a magnetically coupled motor.

8. The cooling assembly of claim 7 additionally comprising an additional opening in the front face through which the motor is accessible.

9. A combination comprising:
a) a cooling assembly comprising:
  i) a front face, having an opening therein and at least one fluid inlet and at least one fluid outlet thereon;
  ii) a back having at least one electrical connector mounted thereon;
  iii) a fan assembly inserted in the opening, the fan assembly having a second electrical connector thereon, the second electrical connector engaging the at least one electrical connector on the back;
  iv) a heat exchanger positioned to be in the air flow caused by the fan assembly;
  v) a pump;
b) the combination further comprising:
  i) a frame;
  ii) an electronic assembly mounted in the frame separate from said cooling assembly, said electronic assembly having at least one electronic component that generates heat;
  iii) a heat absorbing member having fluid, said heat absorbing member located adjacent the electronic component so the fluid absorbs the heat generated by the electronic component to output heated fluid;
  wherein the cooling assembly is mounted in the frame and wherein said pump pumps heated fluid from the heat absorbing member to the heat exchanger and pumps cooled fluid from the heat exchanger to the heat absorbing member.

10. The electronic assembly of claim 9 wherein: the electronic assembly comprises a planar substrate and a height of the cooling assembly is measured in a direction orthogonal to the planar substrate: and the cooling assembly is less than 9 inches in height.

11. The electronic assembly of claim 10 wherein the fan assembly is positioned to direct air flow parallel to the planar substrate.

12. The electronic assembly of claim 9 wherein the fluid reservoir contains a single phase coolant.

13. The electronic assembly of claim 12 wherein the single phase coolant is hydrofluroether.

14. The electronic assembly of claim 12 wherein the heat exchanger of the cooling assembly comprises a radiator having a fluid outlet and the cooling assembly additionally comprises a pipe that connects the fluid reservoir to the fluid outlet of the radiator and wherein the pipe is permanently attached to the radiator.

15. The electronic assembly of claim 9, wherein the fan assembly is accessible through the opening in the front face.

16. The electronic assembly of claim 9, wherein the cooling assembly further comprises: a power supply assembly accessible through the opening in the front face, the power supply assembly having a third connector engaging the at least one electrical connector on the back of the cooling assembly.

17. The electronic assembly of claim 9 wherein the cooling assembly is less than 6 inches in height.

18. The combination of claim 9, wherein the heat absorbing member comprises a cold plate.

19. The combination of claim 9, further comprising a cooling assembly enclosure for enclosing the cooling assembly and an electrical assembly enclosure for enclosing the electrical assembly, wherein the cooling assembly enclosure is located separate and apart from said electrical assembly enclosure.

* * * * *